(12) United States Patent
Park

(10) Patent No.: US 7,830,476 B2
(45) Date of Patent: Nov. 9, 2010

(54) ELECTROLUMINESCENCE DISPLAY DEVICE COMPRISING A DRAIN ELECTRODE BEING DIRECTLY CONTACTED WITH THE UPPER SURFACE OF THE FIRST TRANSPARENT CONDUCTIVE LAYER AND THE SIDE SURFACE OF THE SECOND CONDUCTIVE LAYER AND FABRICATING METHODS THEREOF

(75) Inventor: Yong In Park, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 612 days.

(21) Appl. No.: 11/167,098

(22) Filed: Jun. 28, 2005

(65) Prior Publication Data

US 2006/0147650 A1 Jul. 6, 2006

(30) Foreign Application Priority Data

Dec. 31, 2004 (KR) .................... 10-2004-0118560

(51) Int. Cl.
*G02F 1/136* (2006.01)
*G02F 1/1335* (2006.01)
*G02F 1/1343* (2006.01)
*G02F 1/13* (2006.01)
*G09G 3/10* (2006.01)
*H01L 29/04* (2006.01)
*H01L 27/14* (2006.01)

(52) U.S. Cl. ............................. 349/69; 349/46; 349/47; 349/147; 349/187; 315/169.3; 257/59; 257/72

(58) Field of Classification Search .................. 349/69, 349/46–47, 147, 187; 315/169.3; 257/59, 257/72

See application file for complete search history.

(56) References Cited

U.S. PATENT DOCUMENTS

| 6,403,409 | B1 | 6/2002 | You |
| 6,617,203 | B2 | 9/2003 | Kim et al. |
| 6,753,235 | B2 | 6/2004 | So et al. |
| 7,042,163 | B2 * | 5/2006 | Nagayama ................ 315/169.3 |
| 2001/0003657 | A1 | 6/2001 | Lee |
| 2003/0203643 | A1 * | 10/2003 | Hasei et al. ................. 438/758 |

(Continued)

FOREIGN PATENT DOCUMENTS

JP 8-136951 5/1996

(Continued)

*Primary Examiner*—Brian M. Healy
*Assistant Examiner*—Charles Chang
(74) *Attorney, Agent, or Firm*—McKenna Long & Aldridge

(57) ABSTRACT

A liquid crystal display device includes a first thin film transistor having an active layer, a gate electrode with a double conductive layer structure overlapping the active layer with a gate insulating film there between, a source electrode and a drain electrode connected to the active layer through first and second contact holes which penetrate an interlayer insulating film on the gate insulating film; a pixel electrode having a double layer structure, including a first transparent conductive layer and a second conductive layer, formed on the gate insulating film, wherein a portion of the first transparent conductive layer is exposed through a first transmission hole, which penetrates the interlayer insulating film; a luminescence layer on a portion of the pixel electrode; and a common electrode on the luminescence layer.

23 Claims, 9 Drawing Sheets

U.S. PATENT DOCUMENTS

| | | | |
|---|---|---|---|
| 2004/0012028 A1* | 1/2004 | Park et al. | 257/88 |
| 2004/0164684 A1* | 8/2004 | Inukai et al. | 315/169.3 |
| 2004/0183083 A1* | 9/2004 | Koo | 257/88 |
| 2004/0207785 A1* | 10/2004 | Jang et al. | 349/114 |
| 2005/0077517 A1* | 4/2005 | Chang et al. | 257/59 |
| 2005/0134752 A1* | 6/2005 | Yang et al. | 349/42 |

FOREIGN PATENT DOCUMENTS

| | | |
|---|---|---|
| JP | 2002134756 | 5/2002 |
| JP | 2003076299 | 3/2003 |
| JP | 2003-151770 | 5/2003 |
| JP | 2004-071395 | 3/2004 |
| JP | 2004-119216 | 4/2004 |
| JP | 2004200167 | 7/2004 |
| JP | 2004213004 | 7/2004 |
| KR | 97-003717 | 3/1997 |
| KR | 97-008589 | 5/1997 |
| KR | 97-011966 | 8/1997 |
| KR | 10-0161461 | 8/1998 |
| KR | 10-0175408 | 11/1998 |
| KR | 10-0177785 | 11/1998 |
| KR | 10-0184509 | 12/1998 |
| KR | 10-0192593 | 1/1999 |
| KR | 2000-0025565 | 5/2000 |
| KR | 2000-0026894 | 5/2000 |
| KR | 2000-0026895 | 5/2000 |
| KR | 2000-0031451 | 6/2000 |
| KR | 2000-0041223 | 7/2000 |
| KR | 2000-0075031 | 12/2000 |
| KR | 2001-0019665 | 3/2001 |
| KR | 2001-0019668 | 3/2001 |
| KR | 10-0297706 | 5/2001 |
| KR | 2001-0054739 | 7/2001 |
| KR | 2001-0055071 | 7/2001 |
| KR | 2001-0056037 | 7/2001 |
| KR | 2001-0110917 | 12/2001 |
| KR | 2002-0009188 | 2/2002 |
| KR | 2002-0022258 | 3/2002 |
| KR | 2002-0071061 | 9/2002 |
| KR | 2002-0071062 | 9/2002 |
| KR | 2002-0074897 | 10/2002 |
| KR | 2002-0078116 | 10/2002 |
| KR | 2002-0079196 | 10/2002 |
| KR | 2002-0080202 | 10/2002 |
| KR | 2003-0000619 | 1/2003 |
| KR | 2003-0030286 | 4/2003 |

* cited by examiner

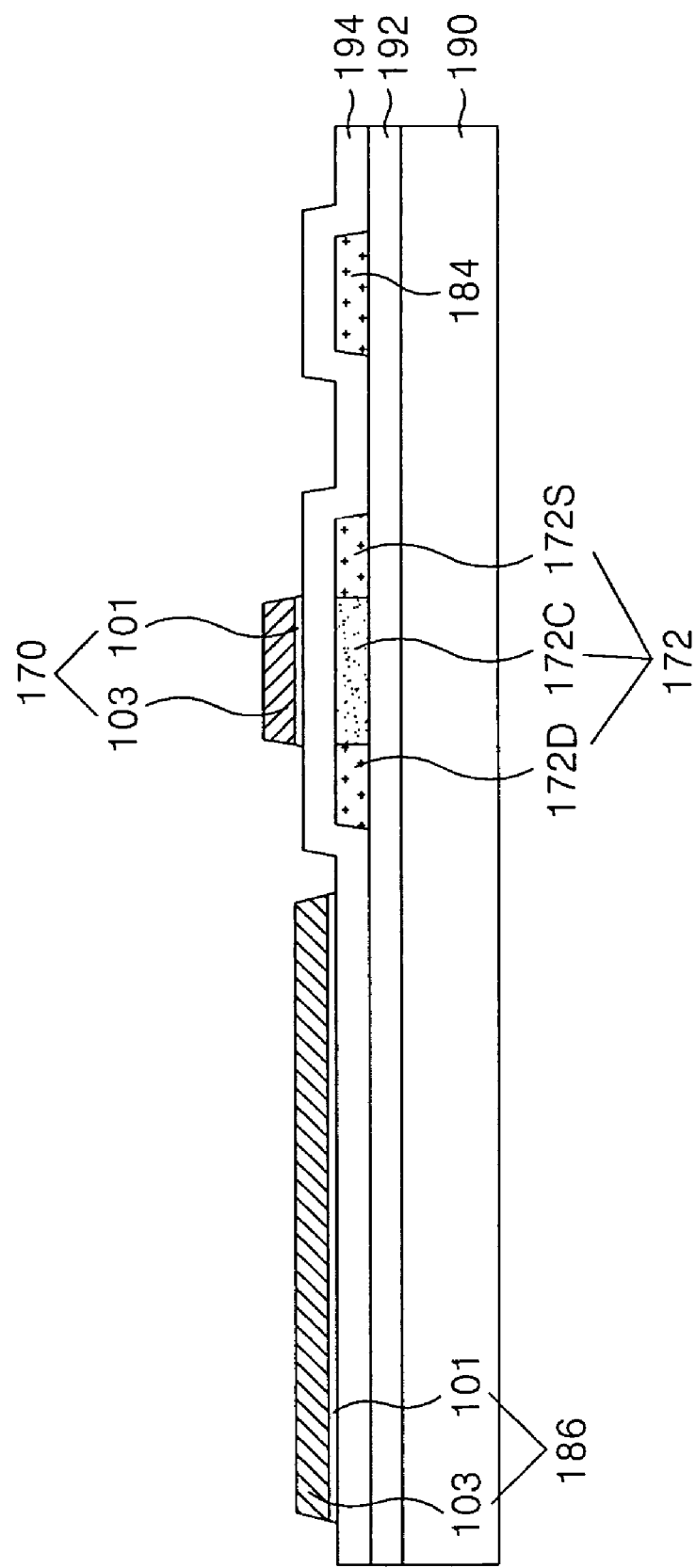

ELECTROLUMINESCENCE DISPLAY DEVICE COMPRISING A DRAIN ELECTRODE BEING DIRECTLY CONTACTED WITH THE UPPER SURFACE OF THE FIRST TRANSPARENT CONDUCTIVE LAYER AND THE SIDE SURFACE OF THE SECOND CONDUCTIVE LAYER AND FABRICATING METHODS THEREOF

This application claims the benefit of the Korean Patent Application No. 2004-118560, filed on Dec. 31, 2004, which is hereby incorporated by reference for all purposes as if fully set forth herein.

BACKGROUND OF THE INVENTION

1. Field of the Invention

The present invention relates to an electro-luminescence display panel, and more particularly to a simplified structure and process of making a thin film transistor array of an EL display panel.

2. Description of the Related Art

Various flat panel display devices have been developed which overcome the weight and size disadvantages of a cathode ray tube (CRT) display device. These flat panel display devices include liquid crystal display (LCD) devices, field emission display (FED) devices, plasma display panel (PDP) devices, and electro-luminescence (EL) display panel devices.

The EL display panel is a self luminous device which makes phosphorus emit light by re-combining electrons and holes. An EL display panel is broadly classified as an inorganic EL or an organic EL based on the material employed in the panel. The EL display panel has many advantages such as low drive voltage, self-luminescence, thin film type, wide viewing angle, fast response speed, high contrast and so on. As a result it is considered to be a next generation display device.

An organic EL device includes an electron injection layer, an electron transport layer, a light-emitting layer, a hole transport layer, and a hole injection layer which are generally deposited between an anode and a cathode. When a designated voltage is applied between the anode and the cathode of an organic EL device, the electrons generated from the cathode move to the light-emitting layer through the electron injection layer and the electron transport layer, and the holes generated from the anode move to the light-emitting layer through the hole injection layer and the hole transport layer. Accordingly, the electrons and the holes supplied from the electron transport layer and the hole transport layer are recombined to emit light in the light emitting layer.

FIG. 1 illustrates an active matrix organic EL display panel. As illustrated in FIG. 1, the organic EL device includes a pixel matrix 20 having a plurality of pixels 28 arranged in areas defined by the crossing of a gate line GL and a data line DL; a gate driver 22 driving the gate lines GL of the pixel matrix 20; and a data driver 24 driving the data lines DL of the pixel matrix 20.

The gate driver 22 sequentially drives the gate lines G1 by supplying a scan pulse. The data driver 24 supplies a data signal to the data lines whenever the scan pulse is supplied. Each pixel 28 receives a data signal from the data line DL to generate light corresponding to the data signal when the scan pulse is supplied to the gate line GL.

In the related art organic EL display panel, a thin film transistor substrate is formed by a plurality of mask processes inclusive of a semiconductor process, thus there is a problem in that its manufacturing process is complicated.

SUMMARY OF THE INVENTION

Accordingly, the present invention is directed to a liquid crystal display device and method of fabrication same that substantially obviates one or more of the problems due to limitations and disadvantages of the related art.

Accordingly, an advantage of the present invention is to provide a thin film transistor substrate of an EL display panel with a simplified structure and a method of fabricating the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, there is provided a liquid crystal display device, comprising: a first thin film transistor having an active layer, a gate electrode with a double layer structure overlapping the poly active layer with a gate insulating film there between, a source electrode and a drain electrode connected to the active layer through first and second contact holes which penetrate an interlayer insulating film on the gate insulating film; a pixel electrode having a double layer structure, including a first transparent conductive layer and a second conductive layer, formed on the gate insulating film, wherein a portion of the first transparent conductive layer is exposed through a first transmission hole, which penetrates the interlayer insulating film; a luminance layer on a portion of the pixel electrode; and a common electrode formed on the luminance layer.

In another aspect of the present invention, there is provided a method of fabricating a liquid crystal display device, comprising: forming an active layer on a substrate; forming a gate insulating film on the active layer; forming a double layer pattern including a pixel electrode and a gate electrode, the gate electrode overlapping the active layer; forming a source area and a drain area by implanting impurities into the active layer; forming an interlayer insulating film on the double layer pattern; forming first and second contact holes exposing the source area and the drain area; forming a first transmission hole exposing a transparent conductive layer of the pixel electrode; forming a source electrode and a drain electrode connected to the source area and the drain area of the active layer on the interlayer insulating film; forming a second insulating film on the source electrode, the drain electrode, and the pixel electrode; forming a second transmission hole exposing the pixel electrode exposed through the first transmission hole; forming a luminance layer on the pixel electrode exposed through the second transmission hole; and forming a common electrode on the luminance layer and the second insulating film.

In another aspect of the present invention, there is provided a method of fabricating a liquid crystal display device comprising: forming a first thin film transistor having an active layer, a gate electrode with a double layer structure overlapping the active layer with a gate insulating film there between, a source electrode and a drain electrode connected to the active layer through first and second contact holes passing through an interlayer insulating film on the gate insulating film; forming a pixel electrode having a double layer structure, including a first transparent conductive layer and a second conductive layer, on the gate insulating film, wherein a portion of the first transparent conductive layer is exposed through a first transmission hole, which penetrates the interlayer insulating film; forming a luminescence layer on a portion of the pixel electrode; and forming a common electrode on the luminescence layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 4A to 4F are sectional diagrams illustrating a method of fabricating the thin film transistor substrate of FIG. 3 according to an embodiment of the present invention.

DETAILED DESCRIPTION OF THE ILLUSTRATED EMBODIMENTS

Reference will now be made in detail to embodiments of the present invention, examples of which are illustrated in the accompanying drawings.

Figure 1:
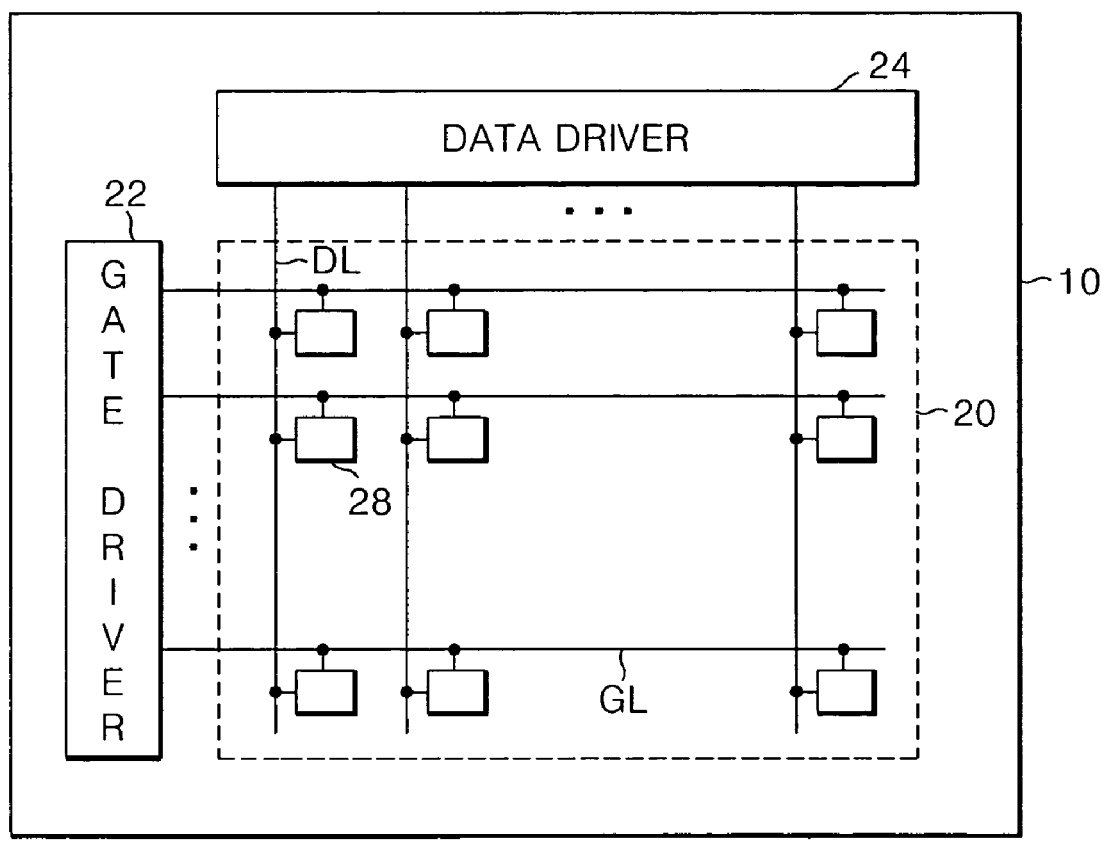
FIG. 1 is a block diagram illustrating an organic EL display panel according to the related art.
Figure 2:
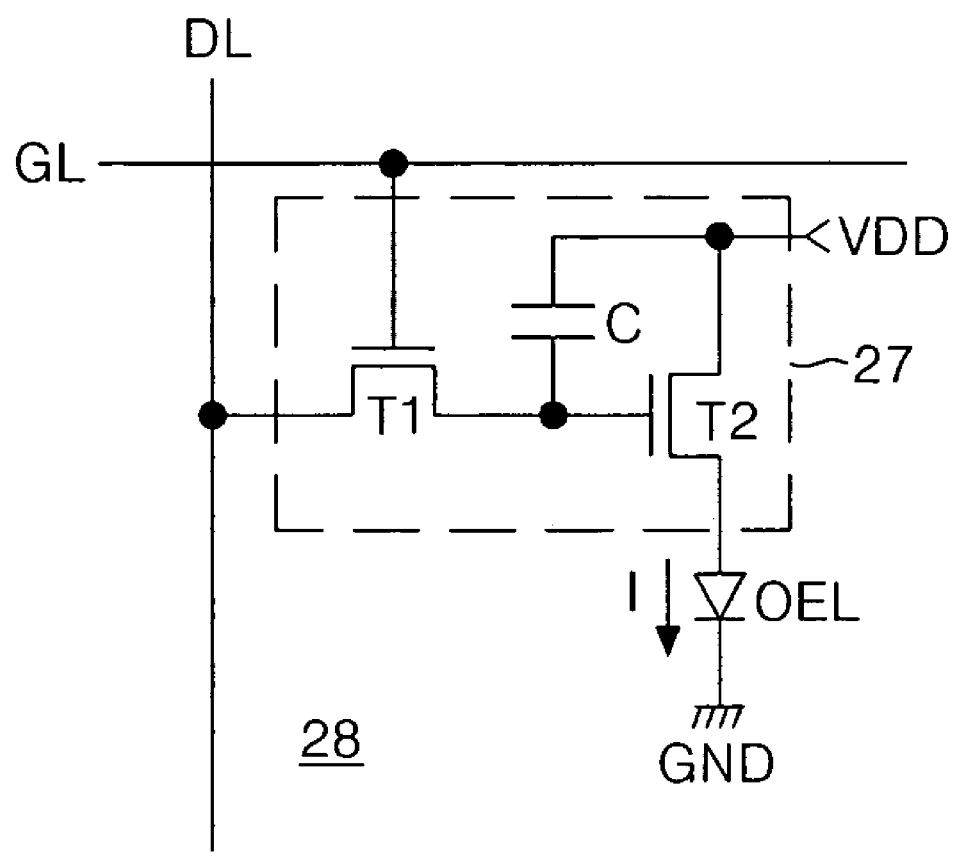
FIG. 2 is an equivalent circuit diagram of a pixel which is included in a thin film transistor substrate of an organic EL panel according to an embodiment of the present invention.
Figure 3:
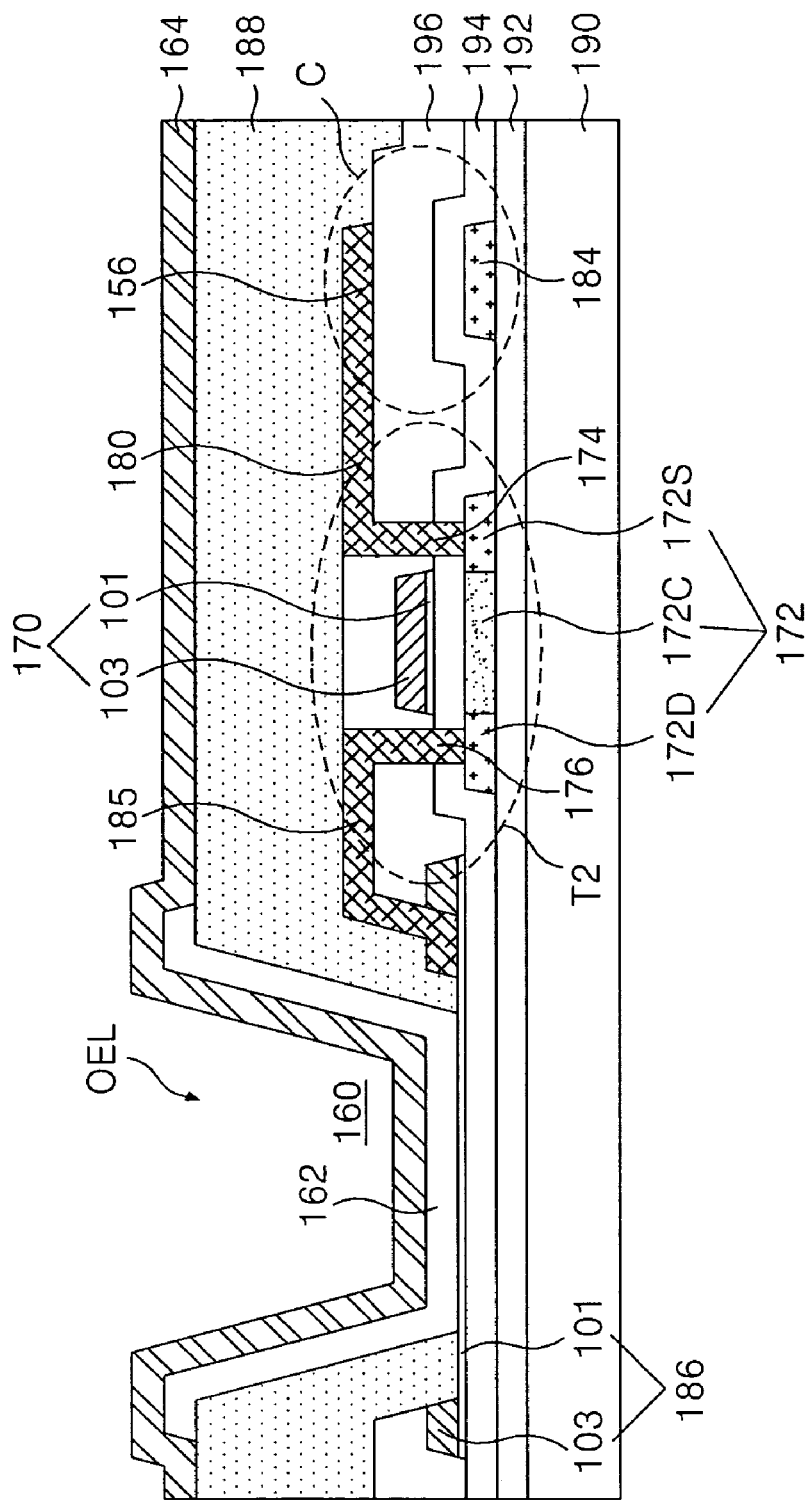
FIG. 3 is a sectional diagram illustrating a vertical structure of a pixel which is included in a thin film transistor substrate of an organic EL panel according to an embodiment of the present invention.

FIG. 2 is an equivalent circuit diagram of a pixel which is included in a thin film transistor substrate of an organic EL panel according to an embodiment of the present invention, and FIG. 3 is a sectional diagram illustrating a vertical structure of a storage capacitor C, a drive thin film transistor T2 and an EL cell (OEL) in the pixel 28 illustrated in FIG. 2.

Referring to FIG. 2, the pixel 28 includes a cell driver 27 connected to a gate line GL and a data line DL, and an EL cell (OEL) connected to the cell driver 27. The cell driver 27 includes a switch thin film transistor T1 connected to the gate line GL and the data line DL; a drive thin film transistor T2 connected between the switch thin film transistor T1, a supply voltage source VDD and an anode of the EL cell (OEL); and a storage capacitor C connected between the supply voltage source VDD and a drain electrode of the switch thin film transistor T1. The gate electrode of the switch thin film transistor T1 is connected to the gate line GL, the source electrode is connected to the data line DL, and the drain electrode is connected to the gate electrode of the drive thin film transistor T2. The switch thin film transistor T1 is formed in the same vertical structure as the drive thin film transistor T2 illustrated in FIG. 3.

As illustrated in FIG. 3, the drive thin film transistor T2 includes an active layer 172 formed on a substrate 190 with a buffer film 192 there between; a gate electrode 170 which overlaps the active layer 172 with a gate insulating film 194 there between; a source electrode 180 and a drain electrode 185 respectively connected to source and drain areas of the active layer 172 through first and second contact holes 174, 176 which penetrate the gate insulating film 194 and an interlayer insulating film 196. The active layer 172 includes a source area 172S and a drain area 172D to which impurities are injected, and a channel area 172C there between. The channel area 172C is overlapped by the gate electrode 170 with the gate insulating film 194 there between.

The gate electrode 170 may be formed with a double layer structure by depositing a transparent conductive layer 101 and a metal layer 103 on the gate insulating film 194. The gate electrode 170 is connected to the drain electrode of the switch thin film transistor T1 through a contact hole (not shown) which penetrates the interlayer insulating film 196 and the gate insulating film 194.

The storage capacitor C is formed by a storage lower electrode 184 that is overlapped by a power line 156 with the gate insulating film 194 and a interlayer insulating film 196 there between. The power line 156 is connected to the supply voltage source VDD illustrated in FIG. 2 and is integrated with and connected to the source electrode 180 of the drive thin film transistor T2. The storage lower electrode 184 may be integrated with the active layer of the switch thin film transistor T1 illustrated in FIG. 2.

The EL cell (OEL) includes an anode, for example, pixel electrode 186, formed on the gate insulating film 194; a second transmission hole 160 which penetrates a bank insulating film 188 and the interlayer insulating film 196 to expose the pixel electrode 186; an organic light-emitting layer 162 formed on the pixel electrode 186 which is exposed through the second transmission hole 160; and a cathode or common electrode 164, commonly formed on the organic light-emitting layer 162 and the bank insulating film 188.

The pixel electrode 186 may include a transparent conductive layer 101 formed on the gate insulating film 194 and a metal layer 103 along the edge of the transparent conductive layer 101. In other words, the transparent conductive layer 101 of the pixel electrode 186 may be exposed through a first transmission hole which penetrates the interlayer insulating film 196 and the metal layer 103. Alternatively, the pixel electrode 186 may be formed of only the transparent conductive layer 101 without the metal layer 103. The pixel electrode 186 is connected to the drain electrode 185 which extends from the drive thin film transistor T2 along the side surface of the first transmission hole. Specifically, the drain electrode 185 is connected to the metal layer 103 (if any) and the transparent conductive layer 101 of the pixel electrode 186 which is exposed through the first transmission hole.

According to the present invention, the pixel electrode 186 is formed on the gate insulating film 194 together with the gate electrode 170, and the power line 156 is formed on the interlayer insulating film 196 together with the source electrode 180 and the drain electrode 185, thereby simplifying the manufacturing process.

Figure 4A:
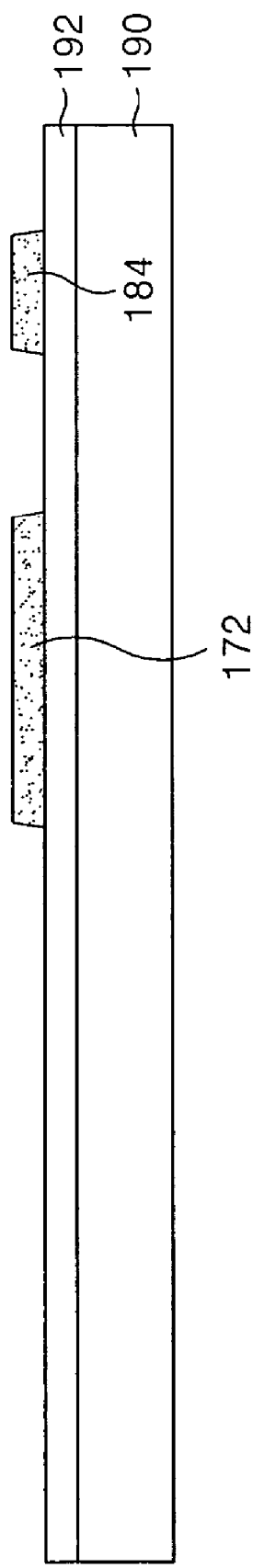

FIGS. 4A to 4F are sectional diagrams illustrating a method of fabricating a TFT substrate of an organic EL display panel according to an embodiment of the present invention. As illustrated in FIG. 4A, a buffer film 192 is formed on a lower substrate 190, and an active layer 172 and a storage lower electrode 184 of the drive thin film transistor T2 are formed on the buffer film 192 using a first mask process. The active layer of the switch thin film transistor T1 illustrated in FIG. 2 is integrated with the storage lower electrode 184.

The buffer film 192 may be formed by depositing an inorganic insulating material such as $SiO_2$ on the whole surface of the lower substrate 190. Then, an amorphous silicon thin film is formed on the buffer film 192 using, for example, low pressure chemical vapor deposition (LPCVD), or plasma enhanced chemical vapor deposition (PECVD), and crystallized to form a poly silicon thin film. The poly silicon thin film is patterned by a photolithography process using a first mask and an etching process to form the active layer 172 and the storage lower electrode 184 of the drive thin film transistor T2. Before the amorphous silicon thin film is crystallized, a dehydrogenation process may be performed to eliminate hydrogen atoms which exist within the amorphous silicon thin film.

An exemplary method of crystallizing the amorphous silicon thin film is sequential horizontal crystallization SLS, wherein an excimer laser annealing method improves the size of a grain by growing the grain in a horizontal direction by scanning a line beam in a horizontal direction.

As illustrated in FIG. 4B, a gate insulating film 194 is formed on the buffer film 192 where the active layer 172 and the storage lower electrode 184 are formed, and the pixel electrode 186 and the gate electrode 170 of the drive thin film transistor T2 are formed with a double layer structure on the gate insulating film 194 using a second mask process. The gate line GL illustrated in FIG. 2 and the gate electrode of the switch thin film transistor T1 are also formed with a double structure.

The gate insulating film 194 may be formed by depositing an inorganic insulating material such as $SiO_2$ on the buffer film 192 where the active layer 172 and the storage lower electrode 184 are formed. Thereafter, a transparent conductive layer 101 and a metal layer 103 are deposited on the gate insulating film 194, for example, using a sputtering method. The transparent conductive layer 101 may be indium tin oxide ITO, thin oxide TO, indium zinc oxide IZO, indium tin zinc oxide ITZO and the like. The metal layer 103 may be Mo, Ti, Cu, AlNd, Al, Cr, Mo alloy, Cu alloy, Al alloy and the like. The metal layer 103 and the transparent conductive layer 101 are then patterned by a photolithography process using a second mask and an etching process, thereby forming the pixel electrode 186 and the gate electrode 170 of the drive thin film transistor T2 having the double layer structure. Although illustrated in FIG. 4B with a double layer structure, the pixel electrode 186 and the gate electrode 170 may be formed with a single layer structure. The gate line GL and the gate electrode of the switch thin film transistor T1 shown in FIG. 2 are formed during this process.

Next, p-type or n-type impurities are injected into the storage lower electrode 184 and the source area 172S and the drain area 172D of the active layer 172 using the gate electrode 170 as a mask. The source and drain areas 172S, 172D of the active layer 172 are opposite to each other with the channel area 172C in between. Impurities are also injected into the source area and the drain area of the active layer of the switch thin film transistor illustrated in FIG. 2.

Figure 4C:
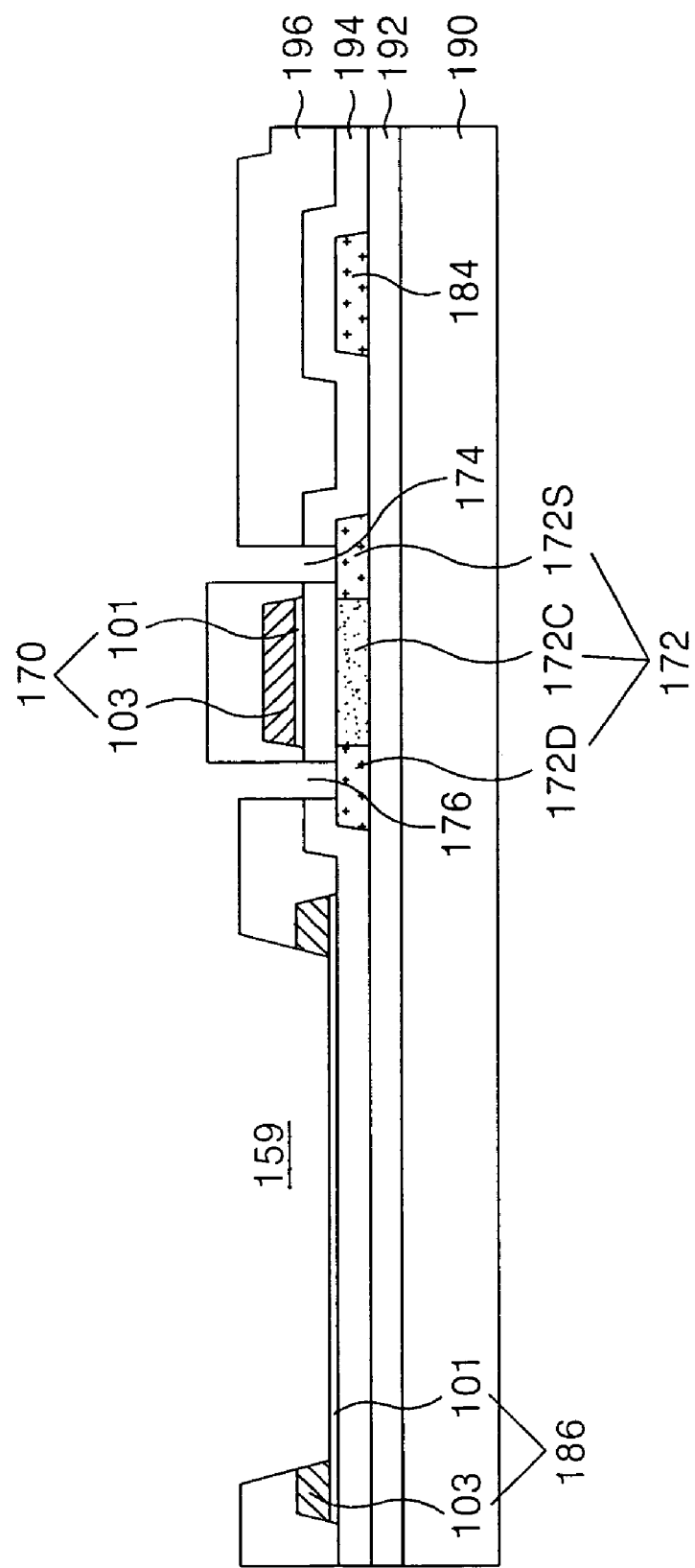

Referring to FIG. 4C, an interlayer insulating film 196 is formed on the gate insulating film 194 including the area where the gate electrode 170 and the pixel electrode 186 are formed using a third mask process. First and second contact holes 174, 176 which penetrate the interlayer insulating film 196 and the gate insulating film 194 and a first transmission hole 159 which penetrates the interlayer insulating film 196 and the metal layer 103 of the pixel electrode 186 are also formed during the third masking process. Contact holes which respectively expose the source and drain areas of the active layer included in the switch thin film transistor T1 of FIG. 2, and a contact hole exposing the gate electrode 170 of the drive thin film transistor T2 for connection with the switch thin film transistor T1 are also formed.

The interlayer insulating film 196 may be formed by depositing an inorganic insulating material, such as $SiO_2$, on the whole surface of the gate insulating film 194 where the gate electrode 170 and the pixel electrode 186 are formed. Thereafter, the first and second contact holes 174, 176 penetrating the interlayer insulating film 196 and the gate insulating film 194 and the first transmission hole 159 penetrating the interlayer insulating film 196 are formed by a photolithography process using the third mask and an etching process. The first and second contact holes 174, 176 expose the source area 172S and the drain area 172D of the active layer 172, respectively. The first transmission hole 159 exposes the metal layer 103 which is an upper layer of the pixel electrode 186. Contact holes which respectively expose the source and drain areas of the active layer included in the switch thin film transistor T1 of FIG. 2, and a contact hole which exposes the gate electrode 170 of the drive thin film transistor T2 for connection with the switch thin film transistor T1 are also formed during this process.

Thereafter, the metal layer 103 of the pixel electrode 186 exposed through the first transmission hole 159 is etched to expose the transparent conductive layer 101. The metal layer 103 overlapping the interlayer insulating film 196 remains behind at the peripheral part of the transparent conductive layer 101.

Figure 4D:
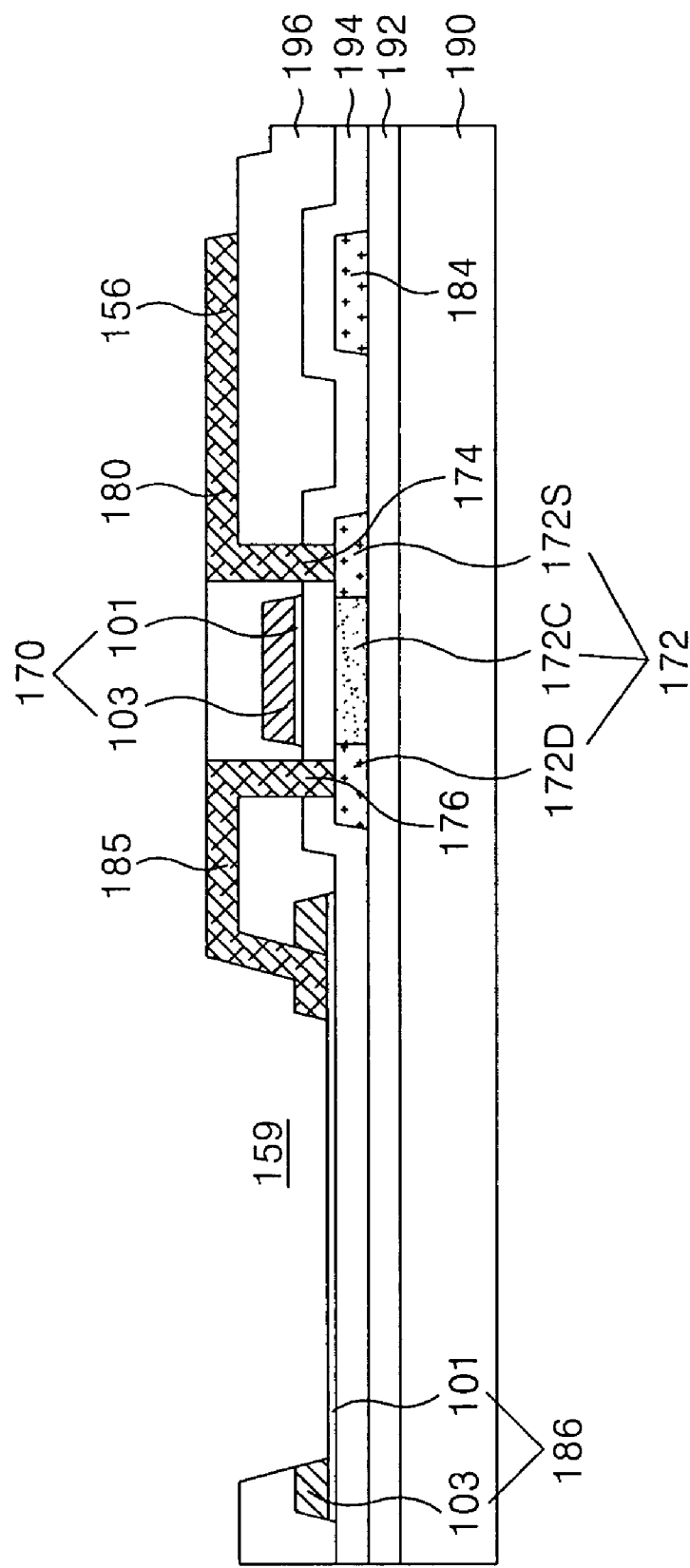

Referring to FIG. 4D, the source electrode 180 and the drain electrode 185 of the drive thin film transistor T2 and the power line 156 connected to the source electrode 180 are formed on the interlayer insulating film 196 using a fourth mask process. The source electrode and the drain electrode of the switch thin film transistor T1 and the data line DL of FIG. 2 are also formed.

A source/drain metal layer is formed on the interlayer insulating film 196. The source/drain metal layer may be formed of a metal material such as Mo, Ti, Cu, AlNd, Al, Cr, Mo alloy, Cu alloy, Al alloy and the like in a single or double layer structure. Subsequently, the source/drain metal layer is patterned by a photolithography process using the fourth mask and an etching process, thereby forming the power line 156 and the source and drain electrodes 180, 185 of the drive thin film transistor T2. The source electrode 180 and the drain electrode 185 are connected to the source area 172S and the drain area 172D of the active layer 172 through the first and second contact holes 174, 176, respectively. The source electrode 180 extends along the side surface of the first transmission hole 159 and the interlayer insulating film 196, and is connected to the transparent conductive layer 10 and the metal layer 103 of the pixel electrode 186 which is exposed through the first transmission hole 159. The power line 156 is connected to the source electrode 180, and overlaps the storage lower electrode 184 with the interlayer insulating film 196 and the gate insulating film 194 there between to form a storage capacitor (C). The source and drain electrodes of the switch thin film transistor T1 and the data line DL illustrated in FIG. 2 are also formed during this process. The source and drain electrode of the switch thin film transistor T1 are connected to the source area and the drain area of the active layer through the corresponding contact holes, respectively, and the drain electrode is connected to the gate electrode 170 of the drive thin film transistor T2 through the corresponding contact hole.

Figure 4E:
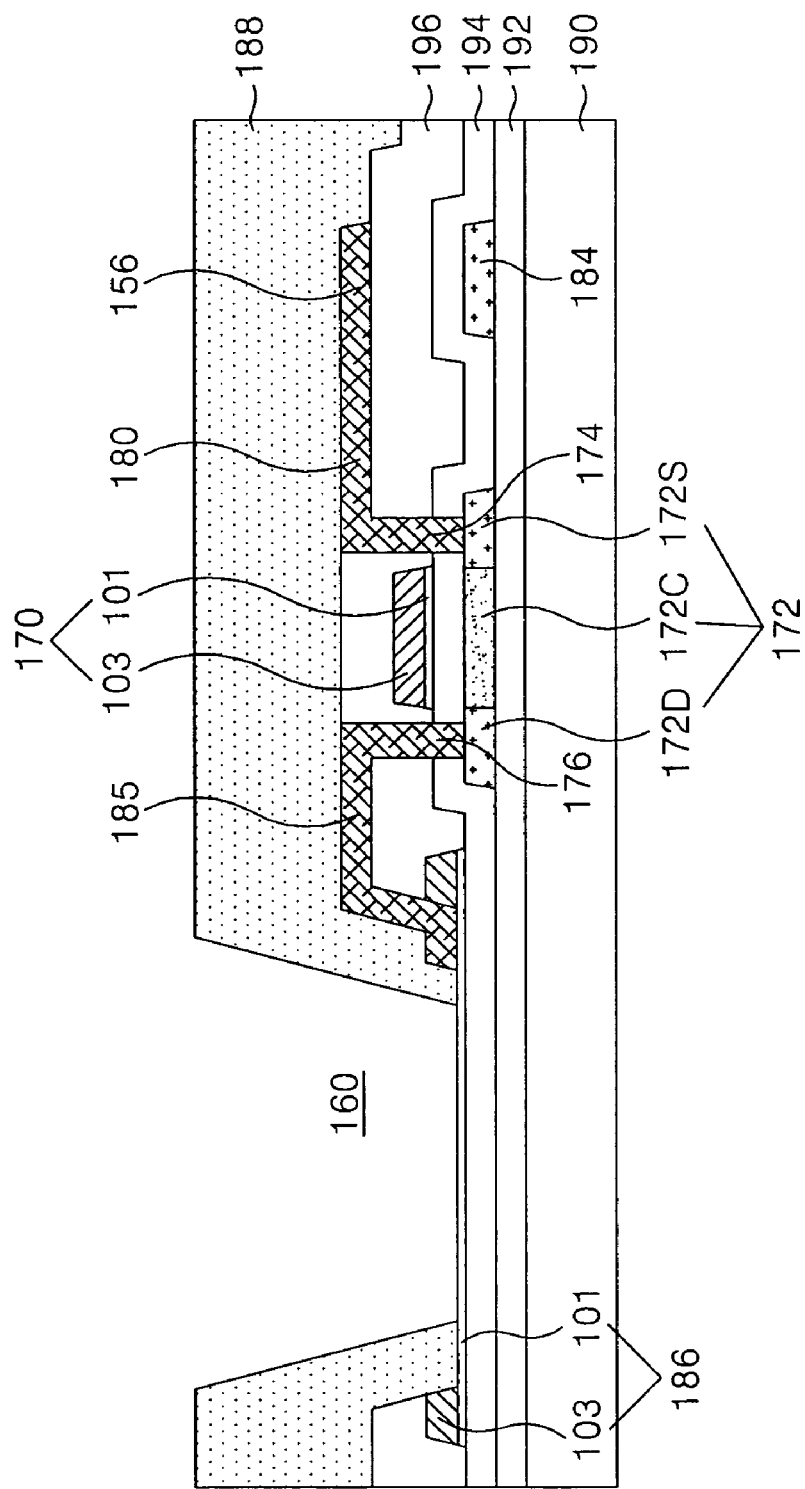

Referring to FIG. 4E, a bank insulating film 188 having a second transmission hole 160 which exposes the transparent conductive layer 101 of the pixel electrode 186 is formed on the interlayer insulating film 196 where the source and drain electrode 180, 185 and the power line 156 are formed using a fifth mask process.

Specifically, an organic insulating material 188 is formed on the interlayer insulating film 196 where the source and drain electrode 180, 185 and the power line 156 are formed. Thereafter, the second transmission hole 160 which penetrates the bank insulating film 188 to expose the transparent conductive layer 101 of the pixel electrode 186 is formed by a photolithography process using the fifth mask and an etching process. Alternatively, a photosensitive organic insulating material may be used for the bank insulating film 188, and the second transmission hole 160 is them formed by the photolithography process only.

Figure 4F:
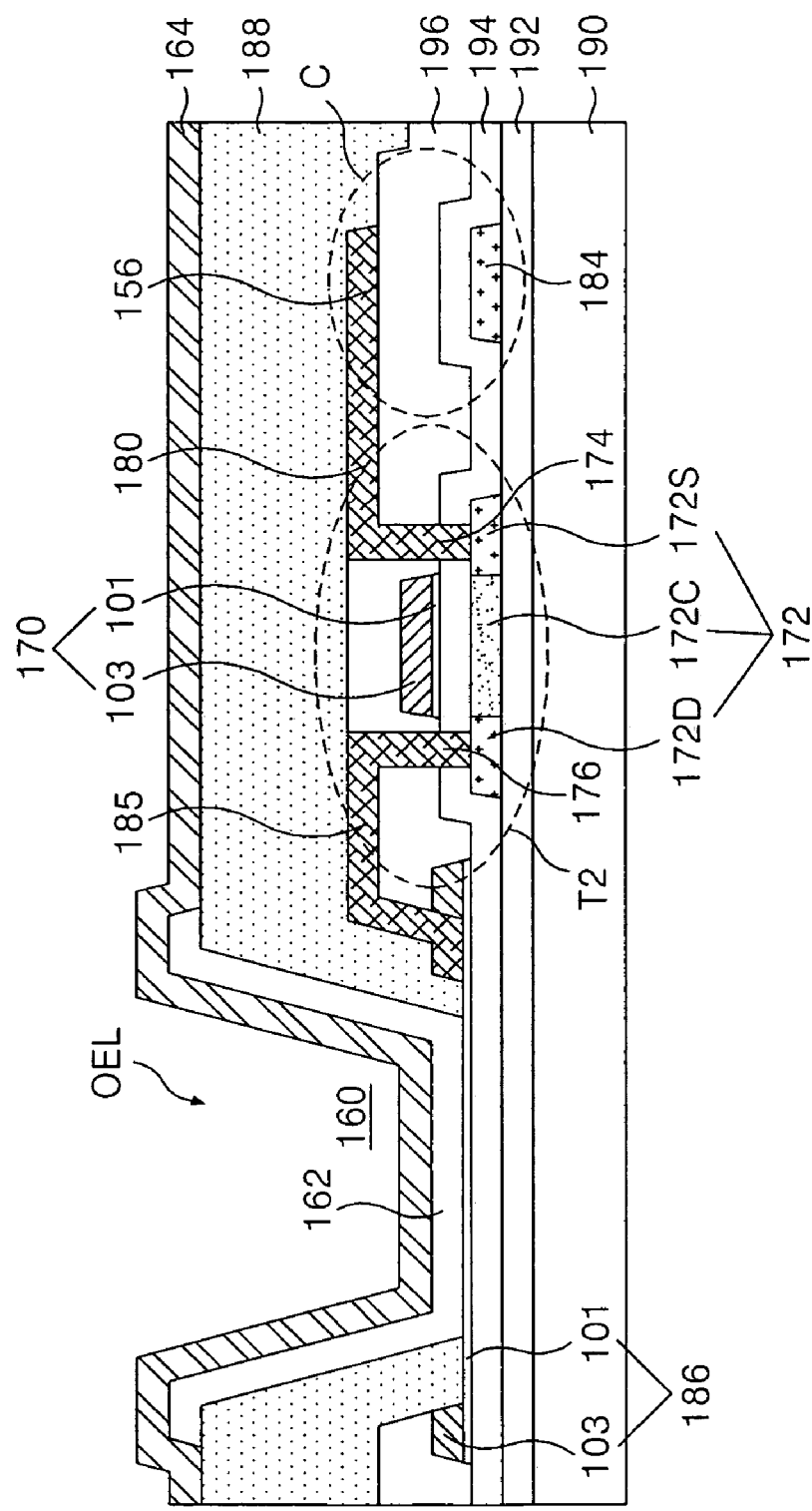

Referring to FIG. 4F, an organic light-emitting layer 162 of any one of R, G, B is formed on the pixel electrode 186 which is exposed through the second transmission hole 160 by a deposition process using a sixth mask, and a common electrode 164 is commonly formed on the organic light-emitting layer 162 and the bank insulating film 188. The organic light-emitting layer 162 formed on the pixel electrode 186 is formed to lay over the upper part of the bank insulating film 188 through the side surface of the bank insulating film 188 where the second transmission hole 160 is formed. Accordingly, there is completed the EL cell (OEL) in which the organic light-emitting layer 162 is formed between the pixel electrode 186 and the common electrode 164. The common electrode 164 is formed of a metal material such as Mo, Ti, Cu, AlNd, Al, Cr, Mo alloy, Cu alloy, Al alloy and the like in a single or double layer structure.

Accordingly, the method of fabricating the thin film transistor substrate of the organic E1 display panel according to the present invention requires five mask processes to form to the bank insulating film 188, thereby simplifying the manufacturing process.

As described above, the thin film transistor substrate of the organic EL display panel and the fabricating method thereof according to the present invention forms the pixel electrode together with the gate electrode on the gate insulating film, thereby simplifying the manufacturing process.

Furthermore, the thin film transistor substrate of the organic EL display panel and the fabricating method thereof according to the present invention forms the power line with the source electrode and the drain electrode on the interlayer insulating film, thereby simplifying the manufacturing process.

Accordingly, the thin film transistor substrate of the organic EL display panel and the fabricating method thereof according to the present invention forms to the bank insulating film which has the second transmission hole exposing the pixel electrode using five mask processes, thus the material cost and the equipment investment cost may be reduced and the yield improved.

It will be apparent to those skilled in the art that various modification and variation can be made in the present invention without departing from the spirit or scope of the invention. Thus, it is intended that the present invention cover the modifications and variations of this invention provided they come within the scope of the appended claims and their equivalents.

What is claimed is:

1. An electroluminescence display device, comprising:
   a first thin film transistor having an active layer, a gate electrode with a double layer structure overlapping the active layer with a gate insulating film therebetween, a source electrode and a drain electrode connected to the active layer through first and second contact holes which penetrate an interlayer insulating film on the gate insulating film;
   an electric power line extended from the source electrode, wherein the electric power line and the source electrode are formed on the interlayer insulating film;
   a pixel electrode having a double layer structure, including a first transparent conductive layer and a second conductive layer formed on the first transparent conductive layer, and directly formed on the gate insulating film, wherein an upper surface of the first transparent conductive layer and a side surface of the second transparent conductive layer are exposed through a first transmission hole, which penetrates the interlayer insulating film and the second conductive layer;
   a luminescence layer on the upper surface of the first transparent conductive layer of the pixel electrode; and
   a common electrode on the luminescence layer,
   wherein the gate electrode and the pixel electrode are directly formed on the gate insulating film, and
   the drain electrode is directly contacted with the upper surface of the first transparent conductive layer and the one side surface of the second conductive layer exposed through the first transmission hole.

2. The liquid crystal display device according to claim 1, further comprising:
   an electric power line on the interlayer insulating film and connected to the source electrode; and
   a storage lower electrode overlapped by the electric power line to form a storage capacitor.

3. The liquid crystal display device according to claim 2, wherein the storage lower electrode is overlapped by the electric power line with the gate insulating film and the interlayer insulating film there between.

4. The liquid crystal display device according to claim 2, wherein the storage lower electrode is formed of an active layer into which impurities are implanted.

5. The liquid crystal display device according to claim 1, further comprising:
   a second insulating film having a second transmission hole exposing a portion of the pixel electrode exposed through the first transmission hole, wherein the luminescence layer is formed on the portion of the pixel electrode exposed by the second transmission hole.

6. The liquid crystal display device according to claim 1, wherein the drain electrode is connected to the pixel electrode through a side surface of the first transmission hole.

7. The liquid crystal display device according to claim 1, wherein the interlayer insulating film overlaps a portion of the pixel electrode.

8. The liquid crystal display device according to claim 7, wherein the portion of the pixel electrode overlapped by the interlayer insulating film includes the first transparent conductive layer and a second metal layer.

9. The liquid crystal display device according to claim 1, wherein the double layer structure of the pixel electrode is formed in a structure that a metal layer on a transparent conductive layer.

10. The liquid crystal display device according to claim 2, further comprising:
    a gate line and a data line crossing each other with the interlayer insulating film there between; and
    a second thin film transistor having a gate electrode connected to the gate line, a source electrode connected to the data line, a drain electrode connected to a gate electrode of the thin film transistor, and an active layer to form a channel between the source electrode and the drain electrode.

11. The liquid crystal display device according to claim 10, wherein the storage lower electrode is connected to the active layer of the second thin film transistor.

12. A method of fabricating an electroluminescence display device, comprising:
forming an active layer on a substrate;
forming a gate insulating film on the active layer;
directly forming a double layer pattern including a pixel electrode and a gate electrode on the gate insulating layer, wherein the gate electrode is overlapped with the active layer, and the pixel electrode and the gate electrode include a first transparent conductive layer and a second conductive layer formed on the first transparent conductive layer, respectively;
forming a source area and a drain area by implanting impurities into the active layer;
forming an interlayer insulating film on the double layer pattern;
forming first and second contact holes exposing the source area and the drain area;
forming a first transmission hole exposing an upper surface of the first transparent conductive layer and a side surface of the second transparent conductive layer of the pixel electrode, wherein the first transmission hole penetrates the interlayer insulating film and the second conductive layer;
forming a source electrode connected to the source area of the active layer, a drain electrode directly connected to the drain area of the active layer and the upper surface of the first transparent conductive layer and the side surface of the second transparent conductive layer of the pixel electrode, and an electric power line extended from the source electrode on the interlayer insulating film, wherein the electric power line and the source electrode are formed on the interlayer insulating film;
forming a second insulating film on the source electrode, the drain electrode, and the pixel electrode;
forming a second transmission hole exposing the first transparent conductive layer of the pixel electrode exposed through the first transmission hole;
forming a luminescence layer on the first transparent conductive layer of the pixel electrode exposed through the second transmission hole; and
forming a common electrode on the luminescence layer and the second insulating film.

13. The method according to claim 12, further comprising:
forming an electric power line on the interlayer insulating film to be connected to the source electrode.

14. The method according to claim 13, further comprising:
forming a storage lower electrode on the substrate together with the active layer.

15. The method according to claim 14, wherein the storage lower electrode is formed of an active layer into which impurities are implanted.

16. The method according to claim 12, wherein forming the source area and the drain area includes implanting the impurities into the active area using the gate electrode as a mask.

17. The method according to claim 12, wherein forming the first transmission hole comprises:

patterning the interlayer insulating film to form the first transmission hole; and
etching an upper conductive layer of the pixel electrode exposed through the first transmission hole.

18. The method according to claim 17, wherein the interlayer insulating film overlaps a portion of the upper conductive layer of the pixel electrode.

19. The method according to claim 12, wherein the double layer structure of the pixel electrode includes a first transparent conductive layer and a second metal layer, the second metal layer being formed on the first transparent conductive layer.

20. The method according to claim 12, further comprising:
forming a buffer film between the substrate and the active layer.

21. The method according to claim 14, further comprising:
forming a gate line and a data line crossing each other with the interlayer insulating film there between; and
forming a second thin film transistor having a gate electrode connected to the gate line, a source electrode connected to the data line, a drain electrode connected to a gate electrode of the thin film transistor, and an active layer to form a channel between the source electrode and the drain electrode.

22. The method according to claim 21, wherein the storage lower electrode is connected to the active layer of the second thin film transistor.

23. A method of fabricating an electroluminescence display device comprising:
forming a first thin film transistor having an active layer, a gate electrode with a double layer structure overlapping the active layer with a gate insulating film there between, source and drain electrodes connected to the active layer through first and second contact holes passing through an interlayer insulating film on the gate insulating film, and an electric power line extended from the source electrode, wherein the electric power line and the source electrode are formed on the interlayer insulating film;
directly forming a pixel electrode having a double layer structure, including a first transparent conductive layer and a second conductive layer formed on the first transparent conductive layer, on the gate insulating film, wherein an upper surface of the first transparent conductive layer and a side surface of the second transparent conductive layer are is exposed through a first transmission hole, which penetrates the interlayer insulating film and the second conductive layer, wherein the gate electrode and the pixel electrode are directly formed on the gate insulating film, and wherein the drain electrode is directly contacted with the upper surface of the first transparent conductive layer and the one side surface of the second conductive layer exposed through the first transmission hole;
forming a luminance layer on the upper surface of the first transparent conductive layer of; and
forming a common electrode on the luminance layer.

* * * * *